United States Patent [19]
Deboy et al.

[11] Patent Number: 6,037,631
[45] Date of Patent: Mar. 14, 2000

[54] SEMICONDUCTOR COMPONENT WITH A HIGH-VOLTAGE ENDURANCE EDGE STRUCTURE

[75] Inventors: Gerald Deboy, Unterhaching; Helmut Gassel, München; Jens-Peer Stengl, Grafrath, all of Germany

[73] Assignee: Siemens Aktiengesellschaft, Munich, Germany

[21] Appl. No.: 09/156,429

[22] Filed: Sep. 18, 1998

[51] Int. Cl.[7] .......................... H01L 29/94; H01L 29/749
[52] U.S. Cl. .......................... 257/339; 257/170; 257/409; 257/494; 257/401
[58] Field of Search .................................. 257/139, 144, 257/170, 171, 339, 394, 401, 409, 494

[56] References Cited

U.S. PATENT DOCUMENTS

| 5,008,725 | 4/1991 | Lidow et al. | |
|---|---|---|---|
| 5,723,890 | 3/1998 | Fujihara et al. | 257/339 |
| 5,757,046 | 5/1998 | Fujihara et al. | 257/339 |

FOREIGN PATENT DOCUMENTS 667423  7/1963  Canada .

*Primary Examiner*—John Guay
*Attorney, Agent, or Firm*—Herbert L. Lerner; Laurence A. Greenberg

[57] ABSTRACT

A semiconductor component having a high-voltage endurance edge structure in which a multiplicity of parallel-connected individual components are disposed in a multiplicity of cells of a cell array. In an edge region, the semiconductor component has cells with shaded source zone regions. During commutation of the power semiconductor component, the shaded source zone regions suppress the switching on of a parasitic bipolar transistor caused by the disproportionately large reverse flow current density. Moreover, an edge structure having shaded source zone regions can be produced very easily in technological terms, in particular in the case of self-adjusting processes, and can thus be produced cost-effectively.

12 Claims, 4 Drawing Sheets

SEMICONDUCTOR COMPONENT WITH A HIGH-VOLTAGE ENDURANCE EDGE STRUCTURE

BACKGROUND OF THE INVENTION

Field of the Invention

The invention relates to a semiconductor component with a high-voltage endurance edge structure. The semiconductor component is formed of a semiconductor body having a first surface and an end region. At least one inner zone of a first conductivity type is disposed in the semiconductor body and borders at least partially on the first surface of the semiconductor body. At least one drain zone borders on the at least one inner zone. Base zones of a second conductivity type are embedded in the semiconductor body along the first surface and source zones of the first conductivity type are embedded in the base zones.

Such semiconductor components can be constructed, for example, as MOSFETs if the drain zone bordering on the inner zone has the same conductivity type as the inner zone. On the other hand, such semiconductor components which can be controlled by the field effect, are also known as IGBTs to the extent that the drain zone is constructed as an anode zone with a conductivity type opposite to that of the inner zone. A semiconductor component, in which a multiplicity of parallel-connected individual components respectively disposed in cells are disposed tightly packed in a cell array is disclosed in U.S. Pat. No. 5,008,725.

In a freewheeling operation, the flooding of the semiconductor substrate with charge carriers of both polarities typically occurs with such semiconductor components. The charge carriers are distributed over the entire inner zone, the charge carriers particularly also diffuse out laterally in the edge region over the active cell array. During subsequent commutation of the inner zone of the semiconductor component, the charge carriers of the one conductivity type flow off uncritically via the large-area drain metallization on the rear of the wafer. While the charge carriers of the respective other conductivity type flow off via the respective base zones and the source electrode on the front of the wafer. The cells disposed in the immediate edge region of the cell array are severely stressed because of the very high reverse flow density there. Depending on the commutation gradient, the cells can be destroyed even in the case of relatively weak reverse flows as a consequence of the switching on of the parasitic bipolar transistors that are present in principle in the case of such a semiconductor component.

Moreover, the undesired voltage breakdowns also occur specifically in avalanche operation. Here, the electric field in the edge region is particularly high, as a consequence of the curvature, caused by the edge, of the doping regions and thus of the asymmetric characteristic of the equipotential lines. Because of the asymmetric field distribution in the edge region, it is possible here even for weak currents to lead to the destruction of the semiconductor component.

In order to avoid such undesired voltage breakdowns, in the case of the semiconductor component of the generic type, annular doping regions are disposed in the edge region outside the active cells. Such protective rings, by which local field strength peaks are to be reduced in the edge region, are known for example, from Canadian Patent No. 667,423. The protective rings described there are floating, that is to say they have no defined potential. It is known that such floating protective rings must have wide dimensions towards the edge, since the electric field strength in the protective rings is reduced to virtually zero.

It is, moreover, possible to connect the protective rings to the source metallization via contact holes. In this case, the non-floating protective rings are at the same potential as the source zone. The production of the floating and non-floating protective rings is, however, extremely complicated and thus very cost intensive, particularly in the case of a self-adjusting technology. The particular problem in the production of the protective rings in a self-adjusting technology resides in the case, in particular, in the avoidance of a short circuit between the source electrode and the gate electrode.

Such protective rings are typically produced by ion implantation. It is known that in ion implantation the semiconductor crystal or its surface is severely disturbed in such a way that the crystal is not optimally recrystallized even in a subsequent repair step. During the subsequent growth of the gate oxide, to the quality of which particularly high requirements are placed, interface charges can be produced at the interface with the semiconductor body and/or moveable or fixed charges can be produced in the gate oxide. The parasitic charges lead to undefined component capacitances in the gate oxide, making it difficult for the semiconductor component to be switched in a defined fashion in this region.

SUMMARY OF THE INVENTION

It is accordingly an object of the invention to provide a semiconductor component with a high-voltage endurance edge structure, which overcomes the above-mentioned disadvantages of the prior art devices of this general type, which permits a simple and space saving configuration and yet ensures a reproducible, high breakdown voltage.

With the foregoing and other objects in view there is provided, in accordance with the invention, a semiconductor component having a high-voltage endurance edge structure, including: a semiconductor body having a first surface and an end region; at least one inner zone having a first conductivity type disposed in the semiconductor body and bordering at least partially on the first surface of the semiconductor body; at least one drain zone bordering on the at least one inner zone; base zones having a second conductivity type embedded in the semiconductor body along the first surface; source zones having the first conductivity type embedded in the base zones; and at least a portion of the source zones disposed in the edge region of the semiconductor body having shaded source zone regions for suppressing a switching-on of a parasitic diode formed of a respective one of the source zones and one of the base zones during a reverse flow of charge carriers.

In accordance with an added feature of the invention, the source zones form a cell array having a multiplicity of cells, and including a multiplicity of parallel-connected individual components disposed in the multiplicity of cells.

According to the invention, the object is achieved by a high-voltage endurance edge structure or pattern of the type mentioned at the beginning, in which at least a portion of the source zones disposed in the edge region of the cell array have shaded source zone regions. In the event of a reverse flow of charge carriers of the first conductivity type, the shaded source zone regions suppress the switching on of a parasitic diode formed by the respective source zone and the base zone.

In the present invention, the semiconductor body is masked by a further resist mask in addition to the mask for producing the source zones. The additional resist mask at least partially covers the source zones of the cells situated in the edge region, as a result of which the covered regions are not doped, or are only weakly doped. The active cell surface of the semiconductor component is certainly reduced by one or more cell rows by this measure, depending on the type of the additional resist mask, the result being a slight increase in the on resistance $R_{DSon}$. However, in a very simple and space saving way the measure suppresses the switching on of parasitic bipolar transistors in the edge region caused by reverse flows of charge carriers in the case of commutation or in avalanche operation.

In this way, the commutation capability and the avalanche strength, which are both very important robustness criteria for a high-voltage endurance power semiconductor component are, likewise, increased to the maximum value which can be reached by a specific transistor technology.

The present invention is particularly advantageous in the case of semiconductor components having overwhelmingly self-adjusting cell concepts, since the adjustment of the additional mask is in no way critical, owing to the very low requirements placed on the accuracy of its adjustment in the region of the half width of the gate electrode. Moreover, the shaded source zone regions can be produced in a single, joint process step together with the source zones. Finally, the wafer process costs in the production of the shaded source zones are small by comparison with the extremely expensive production, described above, of the protective rings with contact hole metallization.

The shaded source zone regions are typically disposed in the regions of the source zones in which the aim is to suppress or at least reduce the formation of a current-carrying channel. Typically, the shaded regions are provided in the cells disposed in the edge region, specifically preferably in the regions of the respective source zones that face the edge.

The cell array of a typical high-voltage endurance power semiconductor component includes a multiplicity of typically uniform, symmetrically constructed, tightly packed cells. It is particularly advantageous when the cells of the cell array have a hexagonal cross-sectional surface. The hexagonal structure permits the densest surface packing of the cells, that is to say an optimum use of the chip area. Moreover, the hexagonal cell structure uses an optimum forward resistance in simultaneous conjunction with an optimum load current. Further advantageous cell structures are yielded in conjunction with the use of approximately square cells and/or rectangular, strip-shaped or triangular cells. However, the invention can also be applied with other cell configurations such as, for example, round or oval cells.

In the case of a cell configuration with hexagonal cells or square cells, it is frequently necessary for suppression of a parasitic bipolar transistor in the edge region of the cell array for at least the two outer cell rows in the edge region of the cell array to have shaded source zone regions. In this case, the proportion of the shaded source zone regions within the respective source zone of a cell is to be dimensioned so as to produce optimum suppression of the parasitic bipolar transistor in simultaneous conjunction with an optimum on resistance. It is typically the case with such cell configuration for the source zones in the outermost cell row to be completely shaded. With the cell rows following the outermost cell row, the proportion of the shaded source zone regions can then be reduced gradually by comparison with the whole source zone. In practice, it is frequently sufficient if the outermost cell row is completely shaded, and the subsequent cell row in the outermost half cell, facing the edge region, is shaded.

Again, a cell configuration with preferably strip-shaped cells is particularly advantageous. It is mostly sufficient with such cells for only the outermost cell row to be shaded in the edge region of the cell array. The shaded source zone regions need only be disposed in the outermost half cell, which faces the edge region.

In the preferred implementation, the shaded source zone regions have the same conductivity type and the same doping concentration as the respective base zones. In this case, the shaded source zone regions can be produced in a very simple way by additional masking.

It goes without saying that it is also conceivable, although also technologically more complicated for the shaded source zone regions to have the same conductivity type, but a lower doping concentration than the corresponding source zones. However, undoped shading regions in the source zones would also be conceivable.

It is particularly advantageous when the drain zone has the same doping as the inner zone. The preferred semiconductor component resulting therefrom is then a power MOSFET. However, the invention can also be used on IGBTs and other semiconductor components. In the case of the IGBTs, the drain zone is then constructed as anode zone. The anode zone is of the opposite conductivity type than the inner zone, and typically has a very high doping concentration. Moreover, the invention can also be used on all types of MOSFET such as, for example, D-MOSFET, V-MOSFET, U-MOSFET, etc.

Other features which are considered as characteristic for the invention are set forth in the appended claims.

Although the invention is illustrated and described herein as embodied in a semiconductor component with a high-voltage endurance edge structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
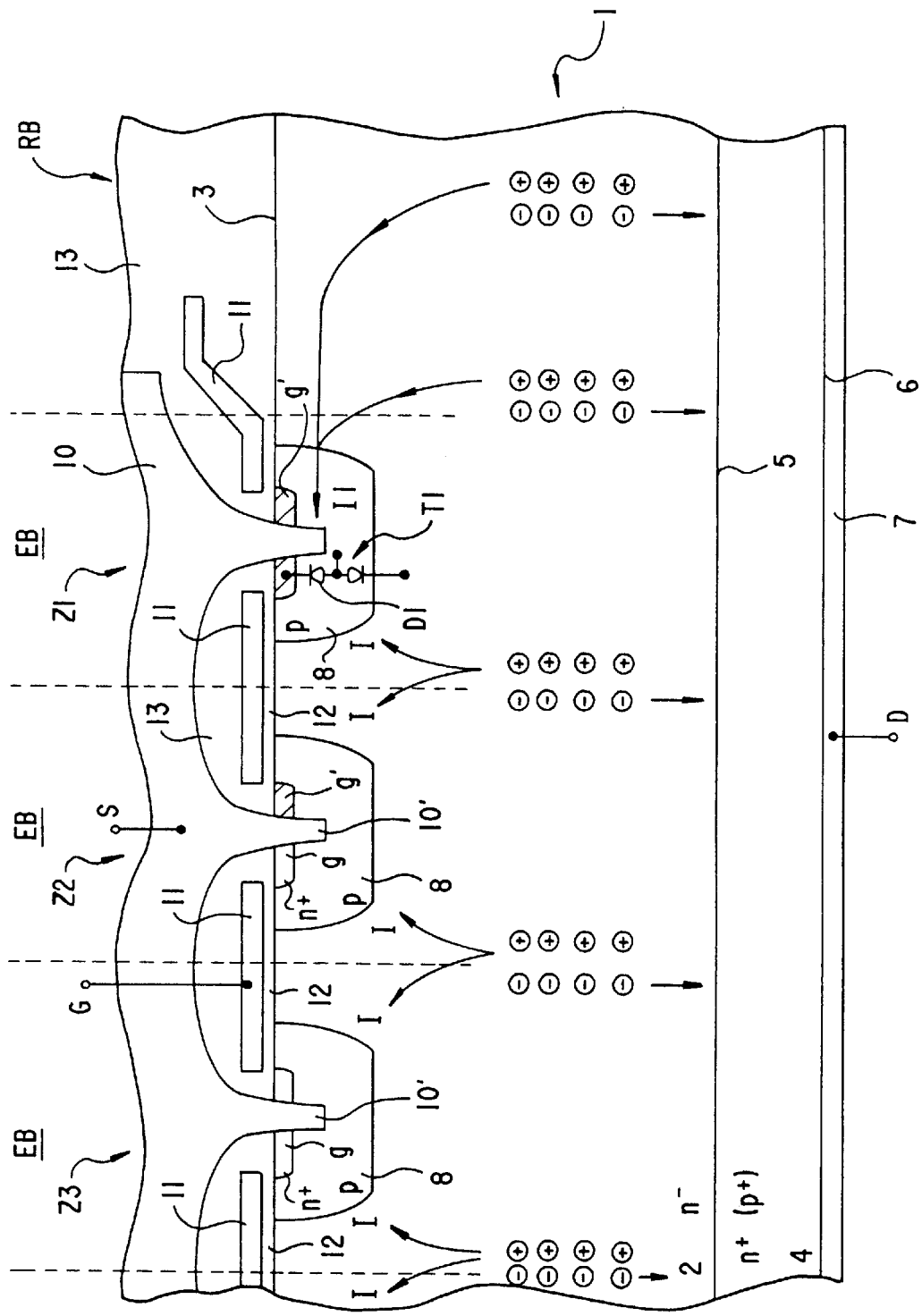
FIG. 1 is a fragmentary, sectional view through an edge structure of a high-voltage endurance semiconductor component constructed here as a D-MOSFET (or IGBT) according to the invention.

Unless otherwise specified, identical reference symbols are used in all the figures of the drawing for identical or functionally identical elements. Referring now to the figures of the drawing in detail and first, particularly, to FIG. 1 thereof, there is shown a partial sectional view through an edge structure of a high-voltage endurance (power) semiconductor component which is constructed here as a D-MOSFET (or IGBT).

The semiconductor component has a multiplicity of parallel-connected individual components EB which are disposed in each case in individual cells. The partial section in FIG. 1 shows segments of three cells Z1 . . . Z3 disposed in an edge region RB of a semiconductor component. The edge region RB here denotes the region of a semiconductor body 1 that is located outside the active cells Z1 . . . Z3. The vertically constructed semiconductor component has a source terminal S, a gate terminal G and a drain terminal D. The source terminal S and drain terminal D are disposed on opposite sides of the semiconductor body 1.

The semiconductor body 1, which consists of a silicon substrate, for example, has an inner zone 2, which is weakly n-doped in the present exemplary embodiment and, on the source side, borders on a first surface 3 of the semiconductor body 1. On the drain side, a drain zone 4 borders on the inner zone 2.

If the semiconductor component is constructed as a MOSFET, the drain zone 4 is typically strongly n-doped. If the semiconductor element is, however, an IGBT, the drain zone 4 is also denoted as an anode zone, and is typically strongly p-doped (as indicated in the brackets). In this case, the interface 5 characterizes the pn junction between the drain zone 4 and the inner zone 2. Moreover, the drain zone 4 borders on the second surface 6 of the semiconductor body 1, and is connected over a large area to a drain electrode 7 and thus to the drain terminal D.

A multiplicity of base zones 8 are embedded in the inner zone 2 on the source-side surface 3. The base zones 8 have an opposite conductivity type to that of the inner zone 2, that is to say they are p-doped in the case indicated. In the present exemplary embodiment, a single, strongly n-doped source zone 9 is embedded in each of the base zones 8. It would also be conceivable for a plurality of source zones 9 to be provided respectively in each of the base zones 8.

In the present exemplary embodiment, the base zones 8 and the source zones 9 embedded therein are of trough-shaped construction and can be produced, for example, by ion implantation and /or by diffusion. However, the base zones 8 and/or source zones 9 typically need not have the same cell structure as the corresponding cells Z1 . . . Z3 in which they are embedded. Such cell structures can be of strip-shaped, hexagonal, triangular, rectangular, round, oval, etc. construction.

The semiconductor component in FIG. 1 is constructed as a vertical D-MOSFET. Of course, it would also be conceivable for the source zones 9 and/or the base zones 8 to be of trench-shaped, V-trench-shaped or similar construction. The corresponding semiconductor component could then be constructed as a trench-MOSFET or as trench-IGBTs.

In FIG. 1, the source zones 9 and the base zones 8 are connected in a known way via contact hole 10' to a source electrode 10, and thus to the source terminal S. It would also be conceivable for the base zones 8 not to make contact with the source electrode 10 via this bypass. However, the bypass of the base zone 8 and the source zone 9 prevents a parasitic bipolar transistor from being switched on there.

Moreover, a gate electrode 11, which is insulated from the semiconductor body 1 by a thin gate oxide 12, is provided on the first surface 3. The gate electrode 11, which is connected to the gate terminal G, can consist, for example, of a highly doped polysilicon or of metal. Furthermore, a field oxide 13 is provided which insulates the source electrode 10 from the gate electrode 11 and from the semiconductor body 1.

According to the invention, shaded source zone regions 9' are provided in the cells Z1 . . . Z3 disposed in the edge region RB. The shaded source zone regions 9' are disposed in this case as a constituent of the source zones 9 inside the source zones 9. In the extreme case, the shaded source zone regions 9' can also occupy the entire area of the corresponding source zone 9. For technological reasons, the shaded source zone regions 9' typically have the same conductivity type and the same doping concentration as the base zones 8. However, it would also be conceivable, although also technically very complicated, for the shaded source zone regions 9' to have the same conductivity type as the corresponding source zones 9, but also at a much lower doping concentration. It would also be conceivable for the shaded source zone regions 9 to be undoped.

All that is essential here is that the configuration of the shaded source zone regions 9' inside the source zones 9 in the edge region RB of the cell array prevents a reverse flow I1 of charge carriers, of holes in the present case, from inadvertently switching on the pn diode D1, and thus prevents the inadvertent switching on of the parasitic bipolar transistor T1 formed from the source zone 9, base zone 8 and inner zone 2.

In the present exemplary embodiment, the outermost cell Z1 in the edge region RB of the cell array has a completely shaded source zone 9, 9'. The next cell Z2 on the inside has only a half-shaded source zone 9, 9', specifically a half-cell directed towards the edge. All further inner cells Z3 have no shaded source zone regions 9'.

It is technologically attractive that the shaded source zone regions 9' require no additional process step for their production, since the shaded source zone regions 9' can advantageously be produced together with the respective source zones 9. Moreover, masking the shaded source zone regions 9' requires no expensive technology, since their placement needs to have a position accuracy only in the region of the half width of the gate electrode.

The method of functioning of the shaded source zone regions 9' according to the invention in the edge region RB of the semiconductor component is explained in more detail below with the aid of FIG. 1.

In the freewheeling operation of the semiconductor component, there is typically flooding of the inner zone 2 with charge carriers. In the present case of an n-channel MOSFET, there is flooding in the inner zone 2 with positive charge carriers (holes) and negative charge carriers (electrons). The charge carriers are distributed in the entire inner zone 2 both in the vertical and in the lateral direction in the order of magnitude of the diffusion length of the respective charge carriers. Particularly in the edge region RB of the semiconductor component, the charge carriers are likewise distributed beyond the active cell region of the semiconductor component.

During subsequent commutation of the semiconductor component, a potential that is negative with respect to the drain terminal D is applied to the source terminal S. As a result, the electrons in the inner zone 2 flow off over the drain zone 4 in the large area over the rear of the wafer 6. The holes flow in the opposite direction over the base zone 8 to the source electrode 10. The result of this is a reverse hole current I directed essentially in the vertical direction and specifically in the direction of the first surface 3.

In the edge region RB of the semiconductor component, that is to say outside the active cell array, the holes located there likewise result in a hole current I1. Because of the missing source zones 9 and source electrodes 10 outside the active cell array, which could absorb the hole current I1, the direction of flow of the hole current I1 additionally has a horizontal component there. The overall quantity of the holes located outside the active cell array then produces a hole current density J1 which is much higher than the hole current density J in the interior of the semiconductor component. The magnitude of the reverse hole current density J1 in the edge region RB of the semiconductor component is, in particular, dependent on the diffusion length of the holes.

The reverse hole current I1 is typically absorbed by the source electrodes 10 of the outermost cells. Because of the essentially horizontally extending reverse hole current I1 in the edge region RB of the semiconductor component, there can be a voltage drop across the diode D1 between the base zone 8 and source zone 9 in the outer cells of the cell array. If the voltage drop exceeds the switch-on voltage of the diode D1, the diode D1, and thus also the parasitic bipolar transistor T1 resulting from the source zone 9, the base zone 8 and the inner zone 2, are switched on (so-called latch effect). The semiconductor component is undesirably switched through. The semiconductor component thus has a lower voltage endurance, at least in the edge region RB.

By providing the shaded source zone regions 9' according to the invention, which are disposed above the current path of the reverse hole current I1, the diode D1 is prevented from switching through, and so also is the parasitic transistor T1. The entire reverse hole current I1 can then be absorbed by the corresponding source electrodes 10, as a result of which the voltage endurance of the entire semiconductor component is also maintained in the edge region RB. The robustness of the semiconductor component can be fully exhausted in this way.

Figure 2:
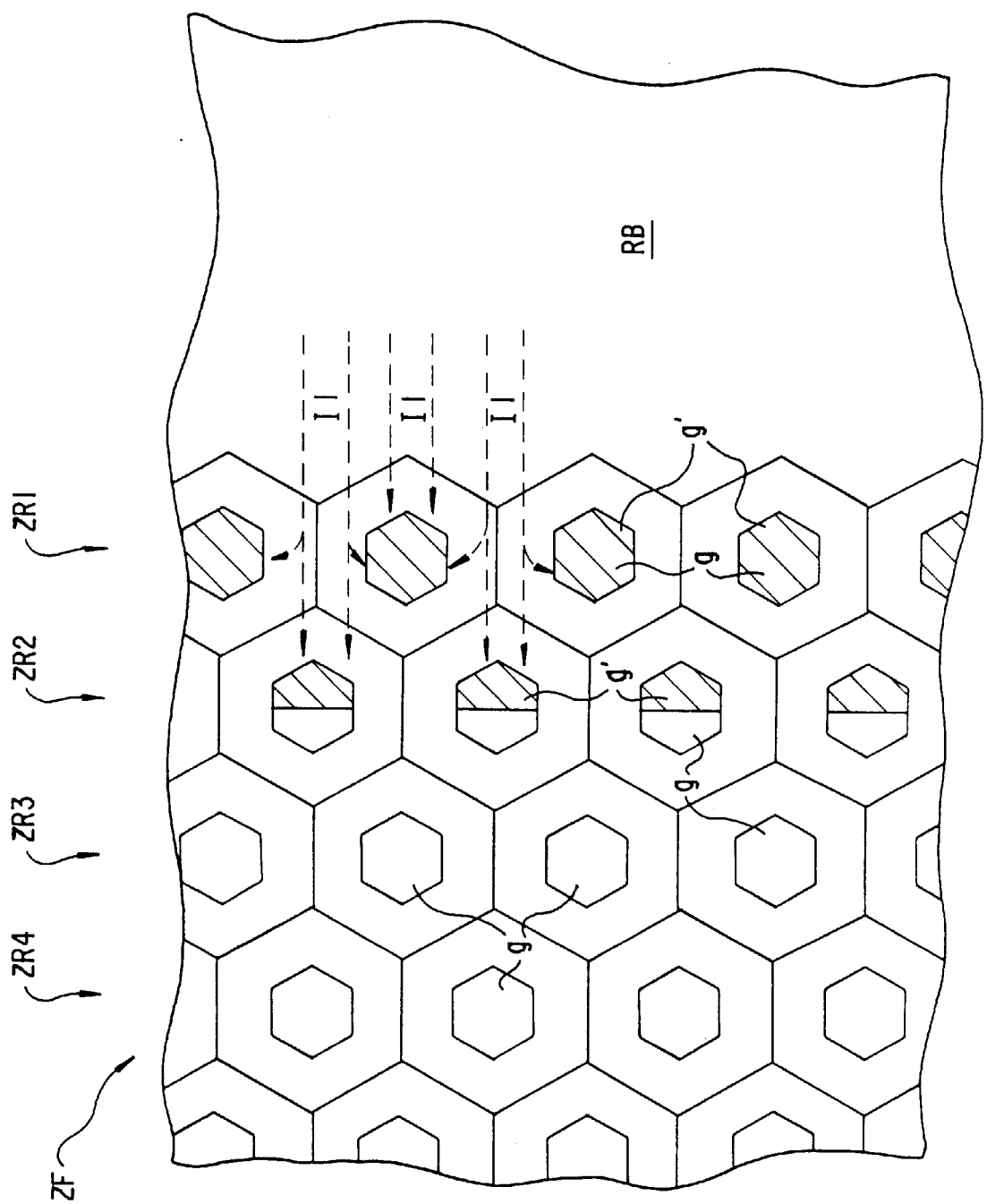
FIG. 2 is a fragmentary, plan view of a layout of a hexagonally constructed cell array in an edge region of the high-voltage endurance semiconductor component in accordance with FIG. 1 and with shaded source zone regions.

FIG. 2 shows a partial plan view of the layout of the hexagonally constructed cell array ZF in the edge region RB of a high-voltage endurance semiconductor component in accordance with FIG. 1 which, in accordance with the invention, has shaded source zone regions 9'. Only the individual cells of the cell array are sketched in the plan view of FIG. 2, together with the source zones 9 and the hole currents I1 in the edge region RB disposed therein. The base zones 8 and the electrodes have not been represented, for the sake of better clarity.

The cell array denoted by ZF has a hexagonal cell configuration with a multiplicity of hexagonally constructed cells of which the four outer cell rows ZR1 . . . ZR4 have been represented in detail. The outermost cell row is denoted here by ZR1. The cell rows ZR2 . . . ZR4 following inwards are provided with rising indices with respect thereto. As mentioned at the beginning, the use of hexagonal cells proves to be particularly advantageous, since by contrast with other cell structures, such as triangular or square cells, for example, the hexagonal cells exhibit a better tiling effect or an optimum surface packing over the area.

In accordance with the partial section shown in FIG. 2, the source zones 9 are completely shaded in the cells of the outermost cell row ZR1. The source zones 9 of the cells of the second outermost cell row ZR2, by contrast, have source zones 9' that are only partially shaded. In the present exemplary embodiment, it is respectively the source zone regions 9' of the half cells directed outwards which are shaded here.

The proportion of the shaded source zone regions 9' inside the respective source zones 9 is to be suitably selected depending on the application, and depends, in particular, on the reverse flow density in the edge region RB. Typically, it is completely sufficient in the case of the hexagonally constructed cell configuration to provide only two cell rows ZR1, ZR2 corresponding to the exemplary embodiment in FIG. 2 with shaded source zone regions 9'. Of course, it would also be conceivable for only a single cell row ZR1 or more than two cell rows ZR1 . . ZR4 to have shaded source zone regions 9'.

Figure 3:
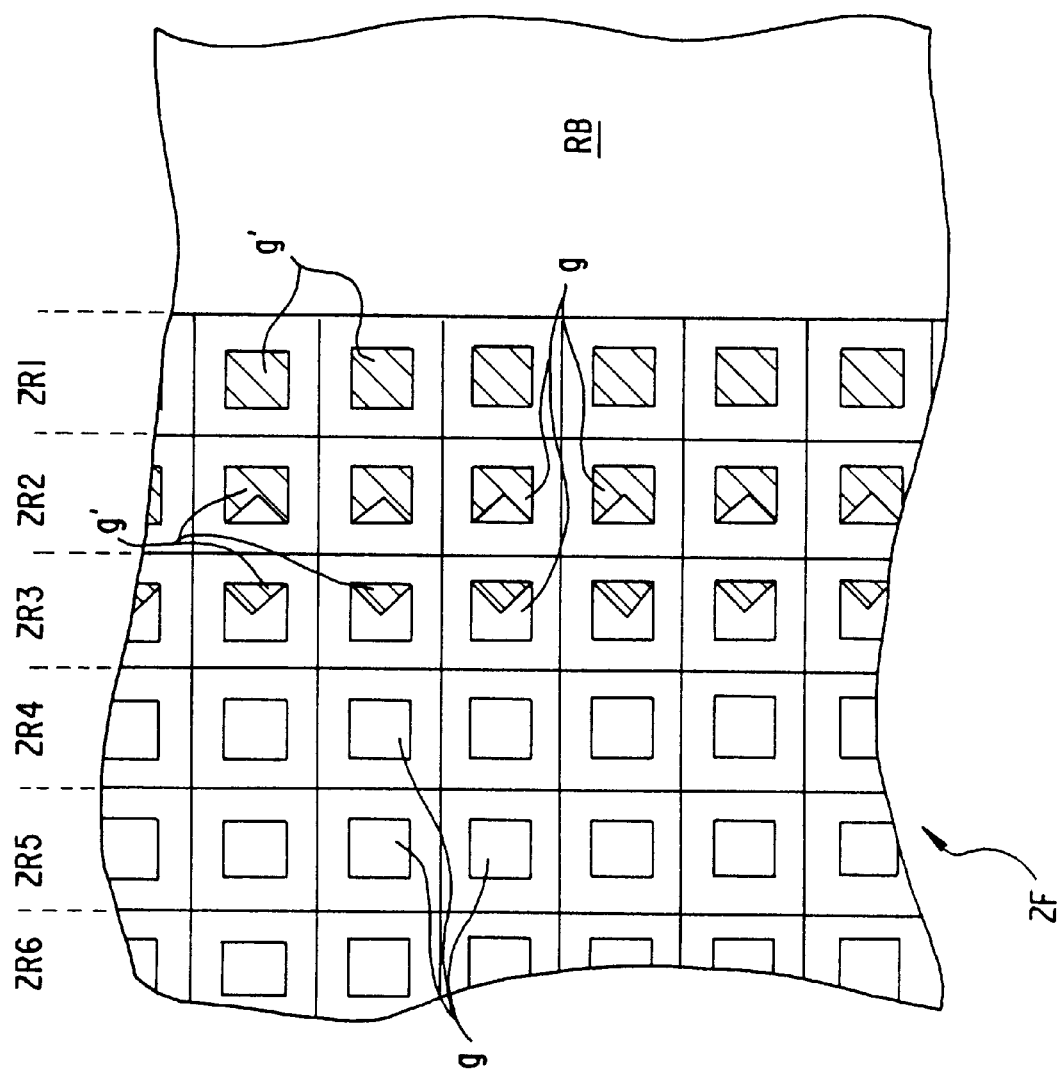
FIG. 3 is a fragmentary, plan view of the layout of a square cell array in the edge region of the high-voltage endurance semiconductor component.

The exemplary embodiment in accordance with FIGS. 1 and 2 respectively describes a hexagonally constructed cell layout that is particularly advantageous, in particular geometrically. The invention is not, of course, limited exclusively to a hexagonal cell array layout, but can also very advantageously be transferred to a cell array layout with square (FIG. 3), triangular, rectangular, strip-shaped (FIG. 4), etc. cells. A cell layout with round or oval cells would also be conceivable.

Depending on the configuration, it is necessary to construct more than two cell rows with shaded source zone regions 9' in the case of a cell field with square cells. In the exemplary embodiment in accordance with FIG. 3, the outer three cell rows ZR1 . . . ZR3 have shaded source zone regions in the edge region RB of the semiconductor component, the proportion of the shaded source zone regions 9' in the respective source zones 9 gradually increasing towards the edge. The further inner cell rows ZR4 . . . ZR6 then do not have shaded source zone regions 9.

Figure 4:
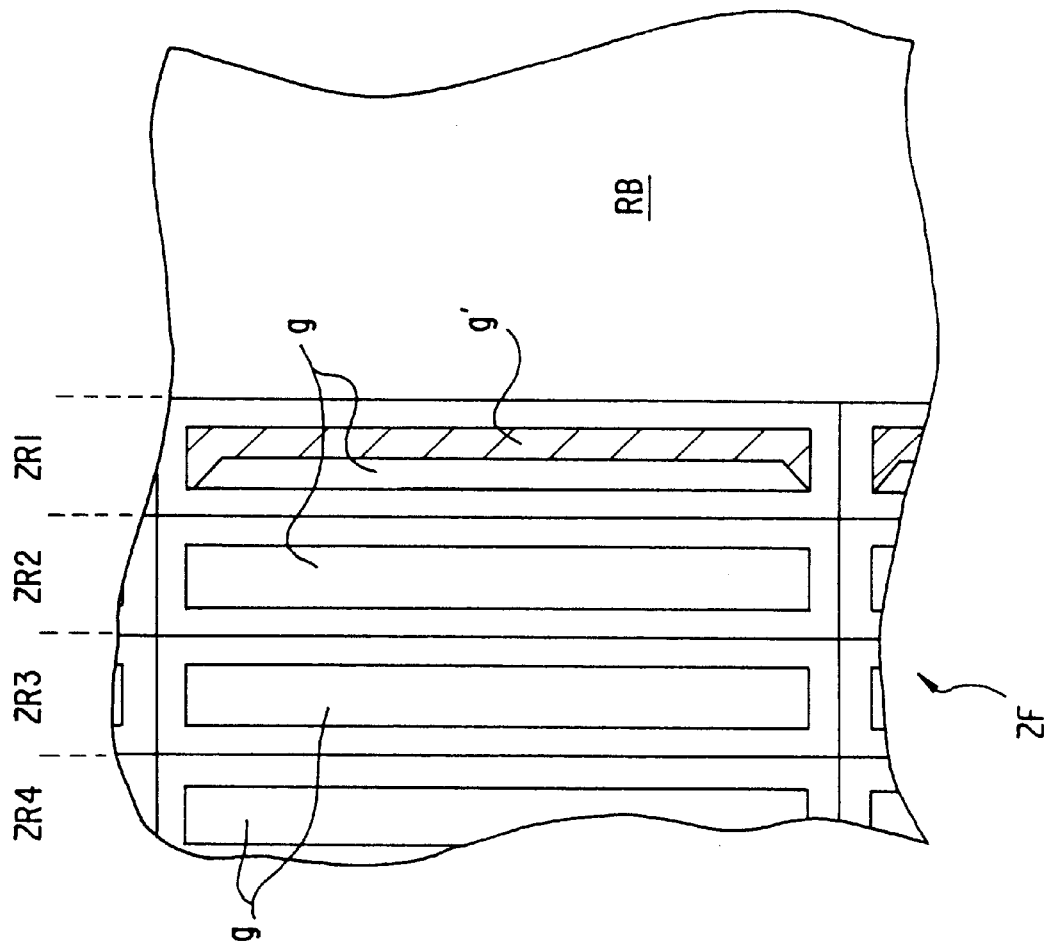
FIG. 4 is a fragmentary, plan view of the layout of a strip-shaped cell array in the edge region of the high-voltage endurance semiconductor component.

FIG. 4 shows a plan view of a strip-shaped cell configuration. In this exemplary embodiment, only the outermost cell or cell row ZR1 is provided with a shaded source zone region 9', the shaded source zone region 9' being disposed there only in the half cell facing the edge. This is completely sufficient in the case of a strip-shaped cell configuration, since the reverse flow coming from the edge region RB outside the active cell array is already completely absorbed by the source electrode 10 of the outermost cell row ZR1.

We claim:

1. A semiconductor component having a high-voltage endurance edge structure, comprising:

a semiconductor body having a first surface;

at least one inner zone having a first conductivity type disposed in said semiconductor body and bordering at least partially on said first surface of said semiconductor body;

at least one drain zone bordering on said at least one inner zone;

base zones having a second conductivity type embedded in said semiconductor body along said first surface;

source zones having the first conductivity type embedded in said base zones and forming a cell array, said cell array having a multiplicity of cells and an edge region;

a multiplicity of parallel-connected individual components disposed in said multiplicity of cells; and at least a portion of said source zones disposed in said edge region of said cell array having shaded source zone regions for suppressing a switching-on of a parasitic diode formed of a respective one of said source zones and one of said base zones during a reverse flow of charge carriers, said cell array having cell rows with at least one outermost cell row of said cell rows disposed in said edge region and said source zones of said at least one outermost cell row having said shaded source zone regions.

2. The semiconductor component according to claim 1, wherein said cell array has square cells.

3. The semiconductor component according to claim 2, wherein said cell array has cell rows with at least two outermost cell rows disposed in said edge region and said source zones of said at least two outermost cell rows have said shaded source zone regions.

4. The semiconductor component according to claim 2, wherein said cell array has cell rows with an outermost cell row disposed in said edge region and said source zones of said outermost cell row are said shaded source zone regions.

5. The semiconductor component according to claim 1, wherein said cell array has strip-shaped cells.

6. The semiconductor component according to claim 5, wherein said cell array has an outermost cell row disposed in said edge region, said edge region having an outer edge, said outermost cell row having a half directed toward said outer edge and said source zones disposed in said half are said shaded source zone regions.

7. The semiconductor component according to claim 1, wherein said shaded source zone regions have a same conductivity type and a same doping concentration as a respective base zone.

8. The semiconductor component according to claim 1, wherein said shaded source zone regions have a same conductivity type and a lower doping concentration than a respective source zone.

9. The semiconductor component according to claim 1, wherein said semiconductor body is a body of a vertical power transistor.

10. The semiconductor component according to claim 1, wherein said semiconductor body is a body of an IGBT.

11. A semiconductor component having a high-voltage endurance edge structure, comprising:

a semiconductor body having a first surface;

at least one inner zone having a first conductivity type disposed in said semiconductor body and bordering at least partially on said first surface of said semiconductor body;

at least one drain zone bordering on said at least one inner zone;

base zones having a second conductivity type embedded in said semiconductor body along said first surface; source zones having the first conductivity type embedded in said base zones and forming a cell array, said cell array having a multiplicity of hexagonal cells and an edge region:

a multiplicity of parallel-connected individual components disposed in said multiplicity of cells; and at least a portion of said source zones disposed in said edge region of said cell array having shaded source zone regions for suppressing a switching-on of a parasitic diode formed of a respective one of said source zones and one of said base zones during a reverse flow of charge carriers.

12. The semiconductor component according to claim 11, wherein said cell array has cell rows with an outermost cell row disposed in said edge region and said sources zones of said outermost cell row are said shaded source zone regions.

* * * * *